United States Patent [19]

Nakashima et al.

[11] Patent Number: 4,503,540

[45] Date of Patent: Mar. 5, 1985

[54] PHASE-LOCKED SEMICONDUCTOR LASER DEVICE

[75] Inventors: Hisao Nakashima, Tokorozawa; Jun-ichi Umeda, Hachioji; Takao Kuroda, Kokubunji; Takashi Kajimura; Hiroshi Matsuda, both of Hachioji, all of Japan

[73] Assignee: Hitachi, Ltd., Tokyo, Japan

[21] Appl. No.: 368,150

[22] Filed: Apr. 14, 1982

[30] Foreign Application Priority Data

Apr. 22, 1981 [JP] Japan ................................. 56-59851

[51] Int. Cl.$^3$ ................................................ H01S 3/19
[52] U.S. Cl. ......................................... 372/47; 357/17; 372/46; 372/50
[58] Field of Search .................... 372/50, 47, 45, 46; 357/17

[56] References Cited

U.S. PATENT DOCUMENTS 4,166,278 8/1979 Susaki et al. .......................... 372/47
4,280,108 7/1981 Scifres et al. .......................... 357/17

FOREIGN PATENT DOCUMENTS 127692 10/1979 Japan ..................................... 372/47

OTHER PUBLICATIONS

Yonezu et al., "High Optical Power Density Emission from a Window-stripe AlGaAs Double-Heterostructure Laser", *Appl. Phys. Lett.* 34 (10) May 15, 1979, pp. 637–639.

Primary Examiner—James W. Davie
Attorney, Agent, or Firm—Kenyon & Kenyon

[57] ABSTRACT

A phase-locked semiconductor laser device comprising a laminated structure in which a plurality of first semiconductor layers having the substantially same composition are stacked in a manner to be sandwiched between second semiconductor layers having a band gap wider, and a refractive index lower, than those of said first semiconductor layers; a third semiconductor layer which is disposed in contact with at least one of side faces of said laminated structure parallel to a traveling direction of a laser beam, which is not narrower in the band gap and not higher in the refractive index than said first semiconductor layers and which does not have the same conductivity type as, at least, that of said first semiconductor layers; means to inject current into an interface between said first semiconductor layers and said third semiconductor layer disposed on the side face of said laminated structure; and means to act as an optical resonator for the laser beam.

4 Claims, 8 Drawing Figures

PHASE-LOCKED SEMICONDUCTOR LASER DEVICE

BACKGROUND OF THE INVENTION

1. Field of the Invention

The present invention relates to a semiconductor laser device.

Specifically, it relates to a phase-locked semiconductor laser device having a plurality of active regions.

2. Description of the Prior Art

One theme of semiconductor laser devices in the future is to attain a high output.

As a solution to the problem, there has been proposed a phase-locked semiconductor laser device.

When active regions are juxtaposed at proper intervals and are respectively caused to emit light, the emitted laser beams interfere with one another.

And the emission light of the phase-locked semiconductor laser device becomes as if it were emergent from a single laser element. Owing to the plurality of active regions, an operation at high output becomes possible.

The phase-locked semiconductor laser device adopts such principle.

Laser devices of this type have been reported in, for example, the following literatures:

(1) APPLIED PHYSICS LETTERS, vol. 33, no. 12, December 1978, pp. 1015–1017, D. R. SCIFRES et al., "Phase locked semiconductor laser array"

(2) APPLIED PHYSICS LETTERS, vol. 34, no. 15, January 1979, pp. 162–165, W. T. Tsang et al., "A densely packed monolithic linear array of GaAs-Al$_x$Ga$_{1-x}$As strip buried heterostructure laser"

(3) European Patent Application Publication No. 10949

SUMMARY OF THE INVENTION

To the end of realizing a semiconductor laser having a plurality of active regions, it is considered to array the active regions in the lateral direction. However, it is attended with an extreme difficulty to laterally array the active regions at narrow gaps of 2 to 3 μm or less.

In order to solve this problem and to obtain a practical laser device, the present invention provides a semiconductor laser device having a structure in which active regions are vertically arrayed. It is easy to array the active regions at the narrow gaps in the vertical direction, by the use of the known molecular beam epitaxy, liquid phase epitaxy or metal organic chemical vapor deposition (MOCVD). To inject carriers into the active region in the lateral direction thereof, is possible by burying the active region in a semiconductor opposite in the conductivity type thereto.

The construction of the present invention has the following features.

A laminated structure is comprised wherein a plurality of first semiconductor layers are stacked in a manner to be sandwiched between second semiconductor layers which are wider in the band gap and lower in the refractive index than the first semiconductor layers, and a third semiconductor layer is disposed in contact with at least one of those side faces of the laminated structure which are parallel to the traveling direction of a laser beam. This third semiconductor layer is made of a semiconductor material which is not narrower in the band gap and not higher in the refractive index than the first semiconductor layers and which does not have the same conductivity type as, at least, that of the first semiconductor layers. Needless to say, there are comprised means to inject current into the interface between the laminated structure and the third semiconductor layer disposed on the side face thereof, and means to act as an optical resonator for the laser beam. It is important that the first semiconductor layers have the same composition with one another. The second semiconductor layers need not always have the same composition with one another. The first semiconductor layers may be non-doped layers as well.

A plurality of beams are generated in the first semiconductor layers serving as active layers. The emitted beams are separated by the second semiconductor layers from one another. However, by causing coherency among the laser beams through the layers, the laser beams from the respective active regions have a coherency of same wavelengths, and same phases, and light just as emitted from a single laser element can be obtained.

DETAILED DESCRIPTION OF THE PREFERRED EMBODIMENTS

An active layer and a clad layer in the present invention are not very different from those of conventional semiconductor laser devices.

An example employing a GaAS-GaAlAs system is outlined as follows:

active layer: Ga$_{1-x1}$Al$_{x1}$As
  $0 \leq x_1 \leq 0.3$
clad layer: Ga$_{1-x2}$Al$_{x2}$As
  $0.2 \leq x_2 \leq 0.8$
where $x_1 < x_2$ In addition, a burying layer is made of Ga$_{1-x3}$Al$_{x3}$As in which $0.2 \leq x_3 \leq 0.8$ holds.

An example employing an InP-InGaAsP system is outlined as follows:

active layer: In$_x$Ga$_{1-x}$As$_y$P$_{1-y}$
  $0.6 \leq x \leq 0.9$, $0.1 \leq y \leq 0.8$ Here, from the standpoint of establishing the lattice matching with InP, the following relation is held:

$$y = 2.16(1-x)$$

In case of an oscillation wavelength of 1.2 to 1.3 μm, $x = 0.75$ and $y = 0.5$ or so.

InP is used for the clad layer and the burying layer.

The thickness of the active layer in the case of the GaAs-GaAlAs system is 1 μm–0.005 μm, preferably 0.1 μm–0.05 μm. On the other hand, the thickness of the intermediate clad layer is set within a range of 5 μm–0.005 μm, preferably 0.2–0.5 μm. The thicknesses of the outermost clad layers which are disposed at the top and bottom of the lamination consisting of the active layers and the clad layers are often made 1–3 μm or so.

The width of a mesa region including the active layers is usually 1-3 μm. Since the size of the emission region depends, at least, upon the diffusion length of carriers, the width of the mesa region is determined in consideration of this point.

According to the present invention, the semiconductor laser device has a structure in which the mesa region including the plurality of active layers is buried from one side or both sides thereof. In view of the level of the present-day semiconductor machining technology, the machining precision of the mesa region is very high, and the controllability of the machining is good. Accordingly, emission spots in the respective active layers do not involve any positional deviation. It can therefore be said that the structure of the present invention is very effective for attaining a high output.

Hereunder, the present invention will be described in detail in conjunction with embodiments.

Embodiment 1

Figure 1:
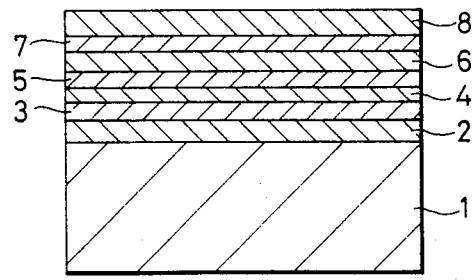
FIGS. 1 to 3 are sectional views of the essential portions of a semiconductor laser device of the present invention showing the manufacturing steps of the device.

FIG. 1 shows an embodiment according to the present invention. On a semi-insulating GaAs substrate crystal 1, n-type $Ga_{0.7}Al_{0.3}As$ layers (doped with Sn; carrier concentration: $5 \times 10^{17}$ cm$^{-3}$) (2, 4, 6, 8) and GaAs layers (undoped; carrier concentration: $1 \times 10^{16}$ cm$^{-3}$) (3, 5, 7) are alternately stacked by the molecular-beam epitaxial method. The composition of the active layers depends upon the oscillation wavelength, and GaAlAs is used for the active layer at some selected wavelengths. Such points are quite the same as in the case of conventional semiconductor lasers. The first and last n-type $Ga_{0.7}Al_{0.3}As$ layers (2 and 8) are 1 μm thick, while the intermediate n-type $Ga_{0.7}AL_{0.3}As$ layers (4, 6) are 0.5 μm thick in this case. The composition and thickness of the intermediate GaAlAs layers (4, 6) have great influences on the interactions of laser beams emergent from the respective active regions. Accordingly, the composition of the first and last GaAlAs layers (2 and 8) and that of the intermediate GaAlAs layers (4, 6) may well be made different. At this time, the mole fraction of AlAs in the composition of the first and last GaAlAs layers (2, 8) may be at least 0.3, while the mole fraction of AlAs in the composition of the intermediate GaAlAs layers (4, 6) should desirably be at most 0.35. This relation of the mole fractions of AlAs corresponds to the case where the active layers (3, 5, 7) are made of GaAs. In a case where the active layers are also made of GaAlAs so as to render the wavelength of the laser beam short, the relation may be considered by shifting the composition of the sandwiching GaAlAs a component in the composition of the active layer GaAlAs. In addition, the thickness of each intermediate n-type GaAlAs layer (2, 4) is allowed to be 5-0.005 μm. The thickness of each GaAs layer (3, 5, 7) being the active layer is 0.1 μm in case of the present example, but it is generally allowed to be 1-0.005 μm or so.

Figure 2:
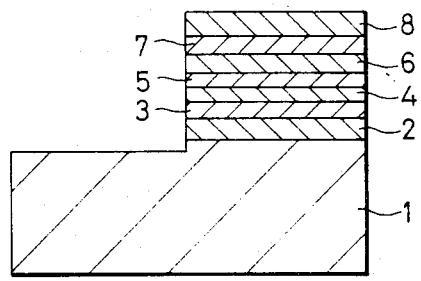
Figure 3:
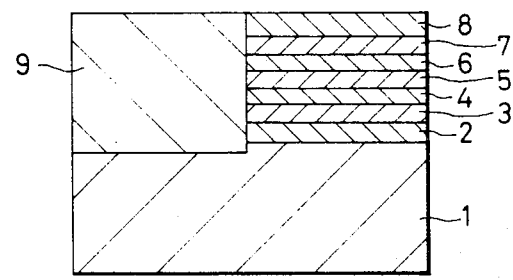
Figure 4:
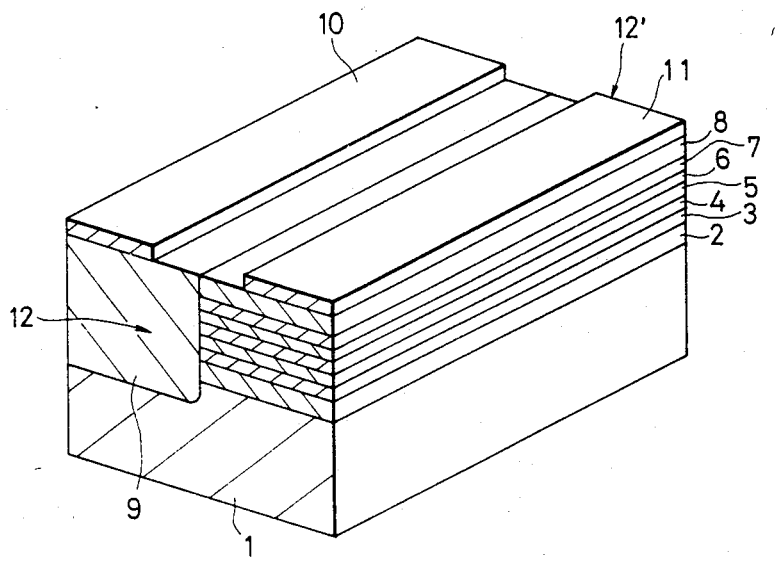
FIGS. 4, 6 and 8 are perspective views of semiconductor laser devices of the present invention.

The multilayer on the substrate is etched into the shape of a mesa down to the substrate crystal 1 by the use of the photolithography employing a photoresist. This state is shown in FIG. 2. Thereafter, using the well-known liquid phase epitaxy, a recess formed by the mesa etching is filled up with a p-type $Ga_{0.7}Al_{0.3}As$ layer (doped with Ge; carrier concentration: $1 \times 10^{18}$ cm$^{-3}$) 9 (refer to FIG. 3). Subsequently, Cr-Au 10 and Au-Ge-Ni 11 are respectively deposited on the p-type $Ga_{0.7}Al_{0.3}As$ layer 9 and the n-type $Ga_{0.7}Al_{0.3}As$ layer 8 by the vacuum evaporation so as to dispose ohmic electrodes on the respective regions. The spacing of the electrodes is 4 μm, including 2 μm on either side of the p-n junction. Thereafter, the crystal is cloven to form reflecting faces 12 and 12' which construct an optical resonator. FIG. 4 shows a perspective view of the semiconductor laser device finished. FIGS. 1 to 3 are sectional views taken along a plane perpendicular to the traveling direction of the laser beam. In case of the present embodiment having a cavity length of 300 μm, there are the three active regions. In principle, however, the number of active regions may be any. It may be designed, depending upon bias current and thermal radiation.

The semiconductor laser device thus fabricated has a threshold current of 60 mA and an output of 300 mW. The spread of a far field pattern is 20 degrees in a direction parallel to the growth plane and 20 degrees in a direction perpendicular thereto, and is isotropic. In addition, a single longitudinal mode and a single transverse mode are established. In the structure of FIG. 4, the conductivity types of the buried layer and the burying layer may of course be converse to the aforementioned ones.

Embodiment 2

Figure 5:
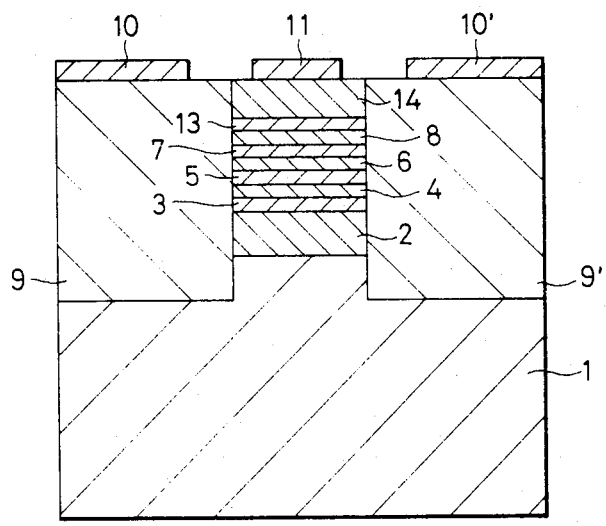
FIGS. 5 and 7 are sectional views of the essential portions of semiconductor laser devices of the present invention.

As a sectional view taken along a plane perpendicular to the traveling direction of a laser beam is shown in FIG. 5, the present embodiment is such that carriers are injected from both sides so as to attain a greater optical output. The multilayer is formed on a substrate by the molecular beam epitaxy as in Embodiment 1 stated before. The compositions, thicknesses and carrier concentrations of the respective layers are as stated in Embodiment 1. The layers 2, 4, 6, 8 and 14 are n-type $Ga_{0.7}Al_{0.3}As$ layers, while the layers 3, 5, 7 and 13 are GaAs active layers. The other conditions are the same as in Embodiment 1. The wafer is etched into the shape of a mesa so as to leave a strip being 2 μm wide, and the parts etched off are filled up with p-type $Ga_{0.7}Al_{0.3}As$ layers (9, 9') by the liquid phase epitaxy. Ohmic electrodes (10, 10' and 11) are as described before. In case of the present embodiment, there are the four active regions, the threshold current is 80 mA, and the optical output is 800 mW.

Embodiment 3

Figure 6:
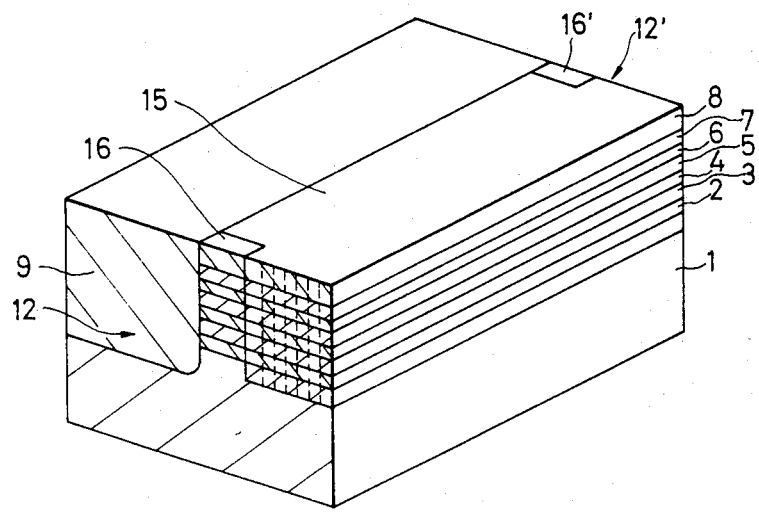

The present embodiment discloses a method for attaining a still higher output. Reference is had to FIG. 6. On a semi-insulating GaAs region 1 grown by the molecular beam epitaxy on predetermined GaAs substrate, n-type $Ga_{0.7}Al_{0.3}As$ layers (doped with Sn; carrier concentration: $5 \times 10^{17}$ cm$^{-3}$) (2, 4, 6, 8) and GaAs layers (undoped; carrier concentration: $1 \times 10^{16}$ cm$^{-3}$) or GaAlAs layers (3, 5, 7) are alternately stacked by the molecular beam epitaxy. The thicknesses of the respective layers are as in Embodiment 1.

Subsequently, the laminated multilayer film described above is etched into the shape of a mesa down to the substrate crystal. The semiconductor wafer thus prepared is diffused with Zn, thereby to make a p-type region 15. In this case, the n-type layers are partly left undiffused as shown at 16 and 16'. This can be readily achieved by employing an $SiO_2$ film or $Al_2O_3$ film as a diffusion mask in the diffusion of Zn. Thereafter, that side of the semiconductor lamination region on which the n-type layers have been left undiffused is etched into the shape of a mesa. The n-type layers 16 and 16' are left behind, and the etching is so deep as to reach the substrate. Subsequently, the recess formed by the etching is filled up with an n-type $Ga_{0.7}Al_{0.3}As$ layer 9. The crystal is cloven along planes perpendicular to the traveling direction of a laser beam, to form reflecting faces 12 and 12' which construct an optical resonator. In this case, the n-type multilayer portion is brought into contact with the cloven planes and the n-types $Ga_{0.7}Al_{0.3}As$ layer 9 as shown in the figure. The n-type multilayer region at this time has a width of 2 $\mu$m and a length of 5 $\mu$m. The provision of electrodes, etc. are the same as in the foregoing embodiments. Electrons injected from the n-type $Ga_{0.7}Al_{0.3}As$ layer 9 recombine in the p-type regions of the GaAs layers, to emit light. Since the n-type regions of the GaAs layers are transparent to the light, no absorption takes place. In general, it is the destruction of cleavage planes by a laser beam that determines the limitation of the output of a semiconductor laser. This destruction occurs due to the positive feedback wherein the temperature rises in the cleavage planes on account of the absorption of the laser beam and wherein the coefficient of absorption increases with the temperature rise. Since the absorption in the cleavage planes does not occur in the semiconductor laser according to the present embodiment, the strength against destruction rises and the optical output can be made as great as 1 W.

Embodiment 4

Figure 7:
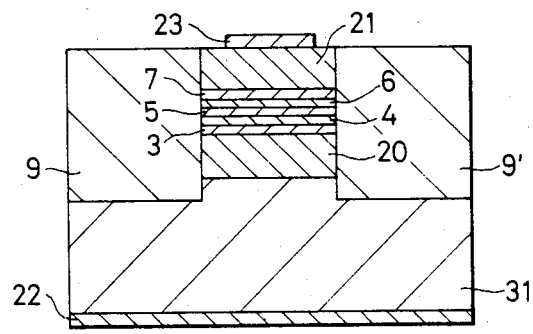

The present embodiment corresponds to a case where n-type GaAs is used for a substrate crystal. FIG. 7 shows a sectional view of the embodiment. On the n-type GaAs substrate crystal 31 (doped with Si; carrier concentration: $1 \times 10^{18}$ cm$^{-3}$), there are grown by the liquid phase epitaxy a semi-insulating $Ga_{0.7}Al_{0.3}As$ layer 20 (resistivity: $10^4$ $\Omega$.cm; thickness: 2 $\mu$m), a lamination in which p-type GaAs layers or p-type GaAlAs layers (3, 5 and 7) (doped with Zn; carrier concentration: $3 \times 10^{17}$ cm$^{-3}$; thickness: 0.1 $\mu$m) and p-type $Ga_{0.7}Al_{0.3}As$ layers (4 and 6) (doped with Zn; carrier concentration: $8 \times 10^{17}$ cm$^{-3}$; thickness: 0.2 $\mu$m) are alternately stacked, and a p-type $Ga_{0.7}Al_{0.3}As$ layer 21 (doped with Zn; carrier concentration: $8 \times 10^{17}$ cm$^{-3}$; thickness: 2 $\mu$m). The laminated wafer having the multilayer structure is etched down to the substrate crystal 31 into the shape of a mesa by the use of the photolithography employing a photoresist. Thereafter, the resulting recesses are filled up with n-type $Ga_{0.7}Al_{0.3}As$ layers 9 and 9' (doped with Sn; carrier concentration: $5 \times 10^{17}$ cm$^{-3}$) by the liquid phase epitaxy. Ohmic electrodes 22 and 23 are respectively formed on the p-type $Ga_{0.7}Al_{0.3}As$ layer 21 and the n-type GaAs substrate crystal 31. Subsequently, the crystal is cloven along planes perpendicular to the traveling direction of a laser beam so as to construct an optical resonator. Here, the semi-insulating $Ga_{0.7}Al_{0.3}As$ layer 20 may be grown with a Ga solution dry-baked at 850° C. in hydrogen gas of high purity for 4 hours. In some cases, it may well be doped with Cr, Fe or the like. The thickness of each active layer, and the composition and thickness of each GaAlAs layer being a clad layer are the same as in Embodiment 1. The cavity length is 300 $\mu$m. The threshold current is 80 mA, and the optical output is 750 mW.

Embodiment 5

Figure 8:
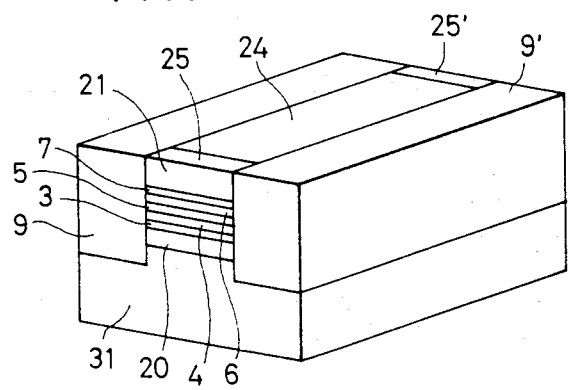

The present embodiment is such that the technical ideas of Embodiments 3 and 4 are combined. Reference is had to FIG. 8. Numeral 31 indicates an n-type substrate crystal, numeral 20 a semi-insulating $Ga_{0.7}Al_{0.3}As$ layer, numerals 3, 5 and 7 n-type GaAs layers (undoped; carrier concentration: $1 \times 10^{16}$ cm$^{-3}$; thickness: 0.1 $\mu$m), numerals 4 and 6 n-type $Ga_{0.7}Al_{0.3}As$ layers (doped with Sn; carrier concentration: $5 \times 10^{17}$ cm$^{-3}$; thickness: 0.2 $\mu$m), and numeral 21 an n-type $Ga_{0.7}Al_{0.3}As$ layer (doped with Sn; carrier concentration: $5 \times 10^{17}$ cm$^{-3}$; thickness: 2 $\mu$m). As in Embodiment 3, Zn is diffused into the multilayer region. Numeral 24 designates a p-type impurity region diffused with the impurity. Herein, n-type portions 25 and 25' are left undiffused in the shape of strips. At this time, the Zn diffusion is stopped midway of the semi-insulating $Ga_{0.7}Al_{0.3}As$ layer 20 so as not to reach the substrate 31. Thereafter, the stacked semiconductor layers are etched into the shape of a mesa. Further, as in the foregoing, n-type $Ga_{0.7}Al_{0.3}As$ layers 9 abd 9' are formed on both the sides of the mesa-etched structure by the liquid phase epitaxy. Electrodes and an optical resonator are the same as shown in Embodiment 5. An optical output of 2 W has been attained at a strip width of 2 $\mu$m, at a cavity length of 300 $\mu$m and with 4 active layers.

Needless to say, as regards the semiconductor materials, the present invention is not restricted to the semiconductor lasers of the GaAlAs-GaAs system, but it is similarly applicable to semiconductor lasers employing a compound semiconductor of a ternary system such as GaAlP, InGaP, GaAsP or GaAsSb system; a compound semiconductor of a quaternary system such as InGaAsP, GaAlAsSb or GaAlAsP system; etc. Naturally, these semiconductor lasers fall within the scope of the present invention.

What is claimed is:

1. A semiconductor laser device comprising:
   a. a laminated structure with a top, bottom and two side faces which are parallel to each other and to the direction of a laser beam to be generated by said device having:
      i. a plurality of first semiconductor layers having substantially the same composition;
      ii. a plurality of second semiconductor layers having a wider band gap and a lower refractive index than said plurality of first semiconductor layers;
      iii. said first and second semiconductor layers stacked such that said first semiconductor layers are sandwiched between said second semiconductor layers;
   b. third semiconductor layers disposed adjacent said side faces, each third semiconductor layer in contact with a respective one of said side faces thereby forming interfaces with said first semiconductor layers, said third semiconductor layers having a band gap which is not narrower than the band gap of said first semiconductor layers and a refractive index which is not higher than the refractive index of said first semiconductor layers, the conductivity type of said third semiconductor layers not being the same as that of said first semiconductor layers;
   c. means to inject current into said interfaces between said first semiconductor layers and said third semiconductor layers; and
   d. means acting as an optical resonator for said laser beam.

2. A semiconductor laser device as claimed in claim 1 and further including further laminated structures at each end of said laminated structure, having a conductivity type opposite to that of said laminated structure, said further laminated structures thereby disposed between said laminated structure and facets of said laser device.

3. A semiconductor laser device as defined claim 1 and further including a semi-insulating semiconductor substrate supporting said laminated structure and said third semiconductor layers.

4. A semiconductor laser device as defined in claim 1 and further including: a semiconductor substrate and a semi-insulating semiconductor layer formed thereon, at least said laminated structure disposed on said semi-insulating semiconductor layer.

* * * * *